(12) United States Patent
Rice et al.

(10) Patent No.: US 6,369,897 B1
(45) Date of Patent: Apr. 9, 2002

(54) FIBER OPTIC RECEIVING ANTENNA

(75) Inventors: Robert Rex Rice, Chesterfield; Mark Steven Zediker, Florissant; Chester Lee Balastra, Wildwood, all of MO (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/493,792

(22) Filed: Jan. 28, 2000

(51) Int. Cl.[7] .................................................. G01B 9/02
(52) U.S. Cl. ........................................ 356/477; 324/96
(58) Field of Search ................................ 356/477, 478, 356/481, 483; 250/227.19, 227.27; 385/12, 14; 324/96

(56) References Cited

U.S. PATENT DOCUMENTS

| | | | |
|---|---|---|---|
| 4,477,723 A | * 10/1984 | Carome et al. | 324/96 |
| 4,904,940 A | 2/1990 | Rempt | |
| 4,906,929 A | 3/1990 | Rempt | |
| 4,929,050 A | * 5/1990 | Wilson | 250/227.19 |
| 5,000,567 A | 3/1991 | Fleshner | |
| 5,164,784 A | 11/1992 | Waggoner | |
| 5,267,336 A | * 11/1993 | Sriram et al. | 356/477 |
| 5,369,410 A | 11/1994 | Reich | |
| 5,670,870 A | * 9/1997 | Muramatsu | 324/96 |
| 5,825,332 A | 10/1998 | Camacho et al. | |
| 5,835,212 A | 11/1998 | Kissa et al. | |
| 5,933,001 A | 8/1999 | Hubbell | |

FOREIGN PATENT DOCUMENTS

JP          40-2228537      *  9/1990

* cited by examiner

*Primary Examiner*—Samuel A. Turner
(74) *Attorney, Agent, or Firm*—Alston & Bird LLP

(57) ABSTRACT

A fiber optic receiving antenna is provided that permits the reception of an incident electric field without re-radiating any portion of the incident power. The fiber optic receiving antenna includes a master oscillator for generating a reference signal and a fiber optic interferometer having first and second arms formed of respective optical fibers for receiving the reference signal. The respective electrooptic activity of the optical fibers that form the first and second arms differ such that the signals propagating along the first and second optical fibers will be modulated differently in response to an incident electric field. The fiber optic interferometer also includes a coupler for combining the signals that have propagated along the first and second arms and been differently modulated by the incident electric field. The fiber optic receiving antenna can also include a detector for receiving the combined signals and for generating a signal that is at least partially dependent upon the incident electric field. As such, a measure of the incident electric field can be determined by the fiber optic receiving antenna. However, the fiber optic receiving antenna does not generate any current and, therefore, does not re-radiate any portion of the incident power.

20 Claims, 2 Drawing Sheets

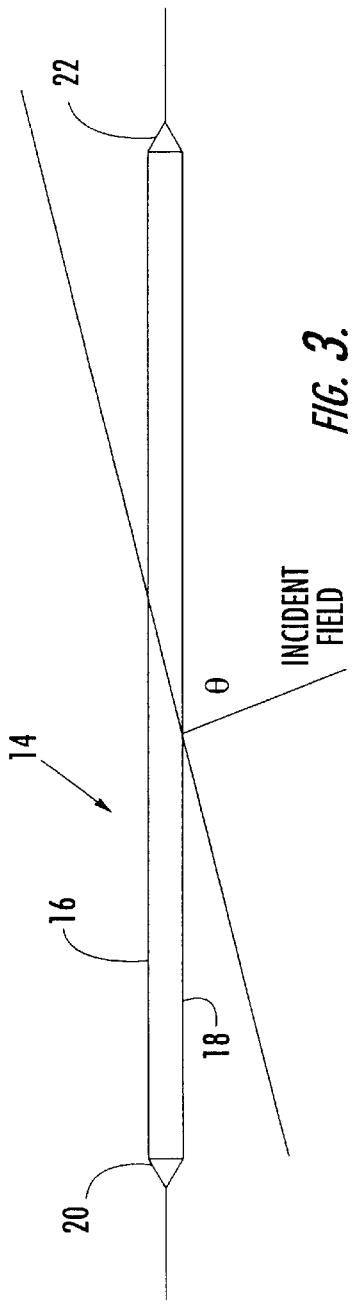
FIG. 3.
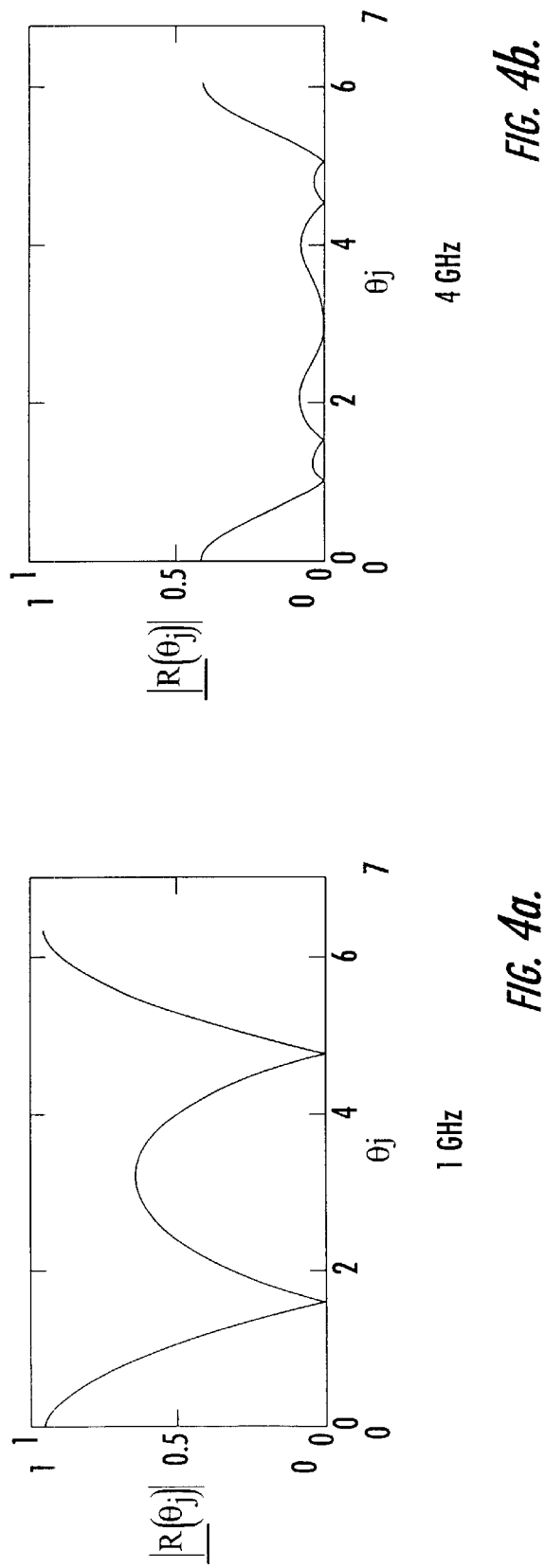
FIG. 4a.
FIG. 4b.

FIBER OPTIC RECEIVING ANTENNA

FIELD OF THE INVENTION

The present application relates generally to a receiving antenna and, more particularly, to a fiber optic receiving antenna that does not re-radiate the incident power.

BACKGROUND OF THE INVENTION

Conventional antennas that are designed to receive signals also tend to re-radiate at least some of the incident power. In this regard, in responding to an incident electric field, such as the incident electric field created by radio frequency (RF) signals, current will be induced in a conventional antenna. This induced current will generally be conducted away from the antenna through a transmission line to a receiver. Unfortunately, the induced current will also cause at least a portion of the incident power to be re-radiated. Accordingly, a conventional receiving antenna can be characterized by an effective aperture which receives the incident signals and a scattering aperture which is a measure of the incident power that is re-radiated by the current induced within the antenna. Under impedance matched conditions a conventional receiving antenna re-radiates about one-half of the incident power.

In some commercial applications, such as instrumentation applications, the re-radiation of a portion of the incident power by a receiving antenna is disadvantageous since the re-radiated portion of the incident power may perturb the electric field that is being measured, thereby impairing further measurements of the electric field. Since conventional antennas are formed of one or more conductive elements, conventional antennas are also disadvantageous in applications in which the antenna will be positioned near a power line or some other electrical hazard.

In addition, antennas are often mounted upon aircraft, including low observable (LO) aircraft. For at least those antennas mounted upon LO aircraft, the re-radiation of any portion of the incident power is disadvantageous. In this regard, if a receiving antenna that is mounted upon a LO aircraft re-radiates even a relatively small portion of the incident power, the radar cross section of the aircraft can he seriously compromised. Under stealthy operating conditions, an LO aircraft will not intentionally transmit or otherwise radiate RF signals. However, it would be desirable to continue to receive RF signals, at least for the purposes of radar warning and signal intelligence, even in instances in which the LO aircraft is operating under stealthy conditions. Unfortunately, the re-radiation of any portion of the incident power will tend to disadvantageously compromise the radar cross section of the aircraft if the aircraft attempts to receive signals when operating in a stealthy condition.

SUMMARY OF THE INVENTION

A fiber optic receiving antenna is therefore provided that permits the reception of an incident electric field without re-radiating any portion of the incident power. As such, the fiber optic receiving antenna is particularly advantageous for those applications in which the re-radiation of at least a portion of the incident power is disadvantageous, such as receiving antennas mounted upon LO aircraft and receiving antennas utilized in commercial applications that do not wish to perturb the incident electric field.

The fiber optic receiving antenna includes a master oscillator for generating a reference signal having a predetermined amplitude and frequency. The fiber optic receiving antenna also includes a fiber optic interferometer. The fiber optic interferometer includes first and second arms formed of respective optical fibers. Each arm receives the reference signal generated by the master oscillator and supports the propagation of the reference signal therealong. According to the present invention, at least one of the optical fibers is electrooptically active. In addition, the respective electrooptic activity of the optical fibers that form the first and second arms differ. As such, the signals propagating along the first and second optical fibers will be modulated differently in response to an incident electric field. In one embodiment, the optical fiber that comprises the first arm is polarized differently than the optical fiber that comprises the second arm. For example, the optical fiber that comprises the first arm can be polarized and the optical fiber that comprises the second arm can be non-polarized. Alternatively, the optical fiber that comprises the first arm can be positively polarized and the optical fiber that comprises the second arm can be negatively polarized.

The fiber optic interferometer also includes a coupler for combining the signals that have propagated along the first and second arms and been differently modulated by the incident electric field. In addition, the fiber optic receiving antenna can include a detector, such as a heterodyne detector and, more preferably, a double balanced coherent receiver, for receiving the combined signals from the coupler and for generating a signal that is at least partially dependent upon the incident electric field. As such, a measure of the incident electric field can be determined by the fiber optic receiving antenna of the present invention. However, the fiber optic receiving antenna of the present invention does not generate any current and, therefore, does not re-radiate any portion of the incident power.

The fiber optic receiving antenna of one advantageous embodiment also includes a phase modulator disposed within one of the first and second arms for tuning the fiber optic interferometer. In this embodiment, the fiber optic receiving antenna can also include a photodetector for receiving the combined signals from the coupler and for driving the phase modulator in response thereto. In this regard, the coupler typically generates first and second outputs based upon the combined signals. The photodetector of this embodiment can therefore receive the second output and output a photocurrent that is used to drive the phase modulator so as to reduce and, more preferably, eliminate, the second output in the absence of an incident electric field. By reducing the second output in the absence of an incident electric field, the fiber optic receiving antenna of this embodiment increases the percentage of the combined signals delivered to the first output to which the detector is responsive, thereby permitting the fiber optic receiving antenna to obtain a more accurate measure of the incident electric field.

According to one embodiment, each optical fiber is designed to preferentially respond to an incident electric field that is oriented at a predetermined angle relative to the optical fiber. By designing each optical fiber so that the anticipated direction of propagation of the incident electric field will be oriented so as to cause the optical fiber to preferentially respond, the differences in modulation introduced by the first and second arms of the fiber optic interferometer are increased, thereby further improving the measure of the incident electric field obtained by the fiber optic receiving antenna.

Accordingly, the fiber optic receiving antenna of the present invention detects an incident electric field and obtains a measure thereof without re-radiating any portion of the incident power. As such, the fiber optic receiving antenna is particularly desirable for commercial applications that do not wish to perturb the incident electric field which, in turn, could disadvantageously alter further measurements. In addition, the fiber optic receiving antenna of the present invention can advantageously be mounted upon or within the skin of an LO aircraft so as to permit signals to be received without re-radiating any portion of the incident power which could otherwise compromise the radar cross section of the LO aircraft.

BRIEF DESCRIPTION OF THE DRAWINGS

FIG. 3 is a diagrammatic illustration of the relative orientation between the direction of propagation of an incident electric field and the optical fibers that form the first and second arms of the fiber optic interferometer of the fiber optic receiving antenna of one embodiment of the present invention.

FIGS. 4a and 4b are graphs depicting the response of a fiber optic receiving antenna according to one embodiment of the present invention as a function of angle of arrival of the incident electric field at 1 GHz and 4 GHz, respectively.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
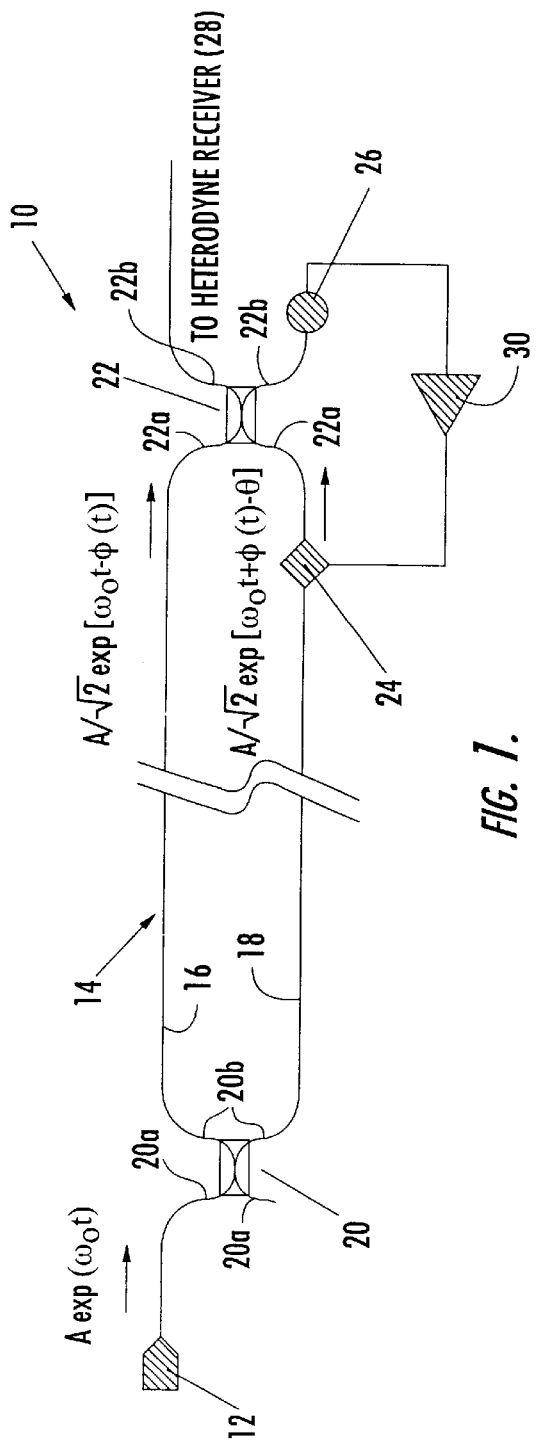
FIG. 1 illustrates a portion of a fiber optic receiving antenna according to one embodiment of the present invention.

Referring now to FIG. 1, a fiber optic receiving antenna 10 according to one advantageous embodiment of the present invention is depicted. The fiber optic receiving antenna can be utilized in a variety of applications, including both commercial and military applications in which the re-radiation of a portion of the incident power is disadvantageous. In one advantageous application, the fiber optic receiving antenna is mounted upon an LO aircraft for receiving signals, such as RF signals, during stealth operating conditions. In this application, the fiber optic receiving antenna can be incorporated into and embedded within the composite structure of the skin of the aircraft. As will be apparent, the fiber optic receiving, antenna of this embodiment is preferably located at or near the outer surface of the skin of the aircraft in order to most efficiently receive the incident signals. Alternatively, the fiber optic receiving antenna can be mounted upon the skin of the aircraft, such as by an adhesive, an epoxy or the like.

As shown in FIG. 1, the fiber optic receiving antenna 10 includes a master oscillator 12 for generating a reference signal having a predetermined amplitude and frequency. For example, the reference signal generated by the master oscillator can be represented as A exp ($\omega_0$t) wherein A is the amplitude of the reference signal and $\omega_0$ is the frequency.

Typically, the master oscillator is a laser source, such as a distributed feedback (DFB) laser, a diode pumped microlaser or a diode pumped fiber laser, although a variety of master oscillators can be employed without departing from the spirit and scope of the present invention.

The fiber optic receiving antenna 10 can also include a fiber optic interferometer 14, such as a Mach-Zehnder interferometer. The fiber optic interferometer includes first and second arms 16, 18 comprised of respective optical fibers that are typically mounted side-by-side. Each arm is designed to receive the reference signal generated by the master oscillator 12. In this regard, the fiber optic interferometer also preferably includes an input coupler 20, such as a 3 dB fiber coupler. As depicted in FIG. 1, a fiber coupler generally includes first and second inputs 20a and first and second outputs 20b. As such, the master oscillator can be optically connected, such as by means of an optical fiber, to one of the inputs of the fiber coupler, while the other input remains open, typically by being terminated with an index matching gel to prevent undesirable reflections. As also shown, the optical fibers that comprise the first and second arms of the fiber optic interferometer are preferably optically connected to the first and second outputs of the input coupler, respectively. As such, when presented with a reference signal that can be represented as A exp(($\omega_0$t), the input coupler will launch a signal that can be represented that A/$\sqrt{2}$ cos(($\omega_0$t) into the optical fiber that forms the first arm and a signal that can be represented as –A/$\sqrt{2}$ sin($\omega_0$t) into the optical fiber that forms the second arm.

Following their launch, the signals propagate through the optical fibers that form the first and second arms 16, 18 prior to being recombined. In this regard, the fiber optic interferometer 14 also includes an output coupler 22, such as another 3 dB fiber coupler, for combining the signals that have propagated along the first and second arms. As depicted in FIG. 1 and as described above in conjunction with the input coupler 20, the output coupler receives first and second inputs 22a and produces first and second outputs 22b. In one advantageous embodiment, the first and second arms of the fiber optic interferometer are optically coupled to the first and second inputs of the output coupler, respectively. In contrast, the first output of the output coupler of this embodiment is typically connected to a heterodyne receiver 28 and the second output of the output coupler typically provides feedback to tune the fiber optic interferometer. Each of these outputs will be subsequently discussed in much greater detail.

The fiber optic receiving antenna 10 is preferably disposed such that an incident electric field, such as the electric field generated by incident RF signals, will impinge thereupon. As described below, the fiber optic receiving antenna is designed such that the incident electric field modulates the signals propagating along the optical fibers of the first and second arms 16, 18 of the fiber optic interferometer 14 in different manners. In particular, the incident electric field typically modulates the signals propagating along the optical fibers that form the first and second arms by introducing different phase shifts thereto.

The optical fibers that form the first and second arms 16, 18 preferably have the same length L. In addition, at least one of the optical fibers is electrooptically active, such as by being a polarized optical fiber. According to the present invention, however, the respective electrooptic activity of the optical fibers that form the first and second arms is different. In the illustrated embodiment of the fiber optic receiving antenna 10, the optical fiber that forms the first arm is a positively polarized optical fiber characterized by an effective linear electrooptic coefficient r. In contrast, the optical fiber that forms the second arm is preferably a negatively polarized optical fiber characterized by an effective linear electrooptic coefficient of −r. As known by those skilled in the art, the effective linear electrooptic coefficient is a measure of the change in the refractive index of an optical fiber in response to an incident electric field. However, both optical fibers need not be polarized. Instead, one of the optical fibers that form the first and second arms could be polarized, such as either positively polarized or negatively polarized, while the other optical fiber remains non-polarized. As described below, the resulting effect of an incident electric field upon the signals propagating along the first and second arms of one fiber optic interferometer 14 is maximized, however, in those embodiments in which the optical fibers that form the first and second arms are positively and negatively polarized. As such, a fiber optic receiving antenna that includes a fiber optic interferometer with oppositely polarized first and second arms will be hereinafter discussed for purposes of example.

In the illustrated embodiment in which the optical fiber that forms the first arm 16 of the fiber optic interferometer 14 is positively polarized and the optical fiber that forms the second arm 18 is negatively polarized, an incident electric field induces a phase shift $+\phi(t)$ to the signals propagating along the first arm and a phase shift of $-\phi(t)$ to the signals propagating along the second arm. Since the incident electric field is time dependent, the phase shift introduced to the signals propagating along the first and second arms is also time dependent. Thus, $\phi(t)$ can be represented as $\phi_0 \cos((\omega_m t))$ wherein $\phi_0$ is the maximum amplitude of the phase shift and $\omega_m$ is the frequency of the incident electric field.

The phase shift $\phi$ is induced by the electric field of the incident signal, such as the incident RF signal, which modifies the effective refractive index $n_0$ of the electrooptically active optical fibers. In this regard, the change in the effective refractive index created by the incident electric field can be represented as $\Delta An = -n_0^3 r E_m / 2$ wherein $E_m$ is the peak amplitude of the incident electric field. Based upon this modification of the effective refractive index of the optical fibers the amplitude of the induced phase shift can be represented as $\phi_0 = (-\omega_0 n_0^3 r / 2c) L E_m = (-\omega_0 n_0^3 r / 2c)(\tau_d c / n) E_m$ wherein c is the speed of light, L is the length of the optical fibers and $\tau_d$ is the time delay for the signal to travel the length of the respective optical fiber. In other words, the amplitude of the phase shift $\phi_0$ is equal to the phase shift that would be induced by a dc field applied to the optical fiber that was equal to the peak amplitude $E_m$ of the electric field.

An additional phase shift $\theta$ is induced in one of the optical fibers, typically the optical fiber that forms the second arm 18 of the fiber optic interferometer 14 in order to set the operating point of the fiber optic interferometer. As such, the fiber optic interferometer of one embodiment includes a phase modulator 24 disposed within one of the arms of the fiber optic interferometer for introducing the additional phase shift $\theta$ in order to tune the fiber optic interferometer. As shown, the phase modulator is typically disposed within the second arm for introducing, a selected phase shift $\theta$.

In this embodiment, the fiber optic interferometer 14 can also include a detector 26, such as a photodetector, that is optically connected to one of the outputs 22b of the output coupler 22, such as the second output as shown in FIG. 1. In operation, the photodetector will produce a photocurrent in response to the signal provided by the output coupler. The photocurrent produced by the detector then serves to drive the phase modulator 24 so as to apply the desired phase shift. In this regard, the photodetector and the phase modulator are designed to provide a predetermined phase shift $\theta$ between the signals propagating along the first and second arms of the fiber optic interferometer in the absence of an incident electric field.

In order to adjust the phase shift $\theta$ introduced by the phase modulator 24, the fiber optic receiving antenna 10 is preferably tuned prior to exposing, the fiber optic receiving antenna to incident electric fields. In order to tune the antennae the master oscillator 12 supplies the reference signal having a predetermined amplitude A and frequency $\Psi_o$ to both arms 16, 18 of the fiber optic interferometer 14. The phase shift induced by the phase modulator is then gradually altered while monitoring the signal presented by the second output 22b of the output coupler 22 to the photodetector 26. The phase shift introduced by the phase modulator is altered until the signal detected by the photodetector is minimized, if not eliminated. The phase modulator is thereafter driven to introduce the phase shift at which the signal detected by the photodetector is minimized. As such, most, if not all, of the signals produced by the fiber optic interferometer would be directed by the output coupler to the first output for receipt by the heterodyne detector 28 and very little, if any, of the signals would be presented by the output coupler to the second output for receipt by the photodetector. Accordingly, the percentage of the signals provided by the fiber optic interferometer that is delivered to the heterodyne detector can therefore be advantageously maximized.

As shown in FIG. 1, the phase modulator 24 is typically driven by the photocurrent generated by the photodetector 26. As also shown in FIG. 1, the photocurrent generated by the photodetector can be amplified and/or filtered by element 30 as necessary in order to drive the phase modulator such that the phase shift introduced by the phase modulator minimizes, if not eliminates, the output presented to the photodetector. As such, the phase modulator as well as the remainder of the feedback loop effectively serves to set the operating point of the fiber optic interferometer 14.

Once exposed to an incident electric field, the signals propagating along the first and second arms 16, 18 are modulated as a result of the combined effect of phase shifts induced by the incident electric field and phase shifts introduced by the phase modulator 24. The signals presented to the output coupler 22 by the first and second arms are therefore represented as $A/\sqrt{2} \cos[\omega_0 t - \phi(t)]$ and $A/\sqrt{2} \sin[\omega_0 t + \phi(t) - \theta]$, respectively. Presented with these inputs, a 3 dB fiber output coupler will produce outputs of:

$$A[\sin(\omega_0 t)\cos\phi + \cos(\omega_0 t)\sin\phi - \cos(\omega_0 t)\cos(\phi-\theta) + \sin(\omega_0 t)\sin(\phi-\theta)]/2 \qquad (1)$$

$$-A[\sin(\omega_0 t)\cos\phi - \cos(\omega_0 t)\sin\phi + \sin(\omega_0 t)\cos(\phi-\theta) + \sin(\omega_0 t)\sin(\phi-\theta)]/2 \qquad (2)$$

at the first and second outputs 22b, respectively.

In order to simplify the following calculations for one exemplary embodiment of a fiber optic receiving antenna 10 of the present invention, the phase shift $\theta$ induced by the phase modulator 24 will be assumed to be 0°. As will be apparent, however, the phase shift induced by the phase modulator can be a variety of other angles, if so desired. By recognizing that $\phi(t)$ is small, the signal provided by the second output of the output coupler 22 to the photodetector 26 can be approximately represented as $-A \sin(\omega_0 t)$. In addition, since $\phi(t)$ is equal to $\phi_0 \cos(\omega_m t)$, the signal provided by the first output of the output coupler to the heterodyne detector 28 is $A\phi_0 \sin(\omega_0 t)\cos(\omega_m t)$ which can be expressed as:

$$A\phi_0\{\sin[(\omega_0-\omega_m)t]+\sin[(\omega_0+\omega_m)t]\}/2. \quad (3)$$

As set forth by equation (3), the signal provided by the first output of the output coupler 22 to the heterodyne detector 28 includes upper and lower modulation sidebands. However, the carrier has been suppressed. With respect to each sideband, the signal amplitude is proportional to the amplitude A of the reference signal produced by the master oscillator 12 and the amplitude of the phase shift $\phi_0$ induced by the incident electric field which, in turn, is proportional to the strength of the incident electric field.

Figure 2:
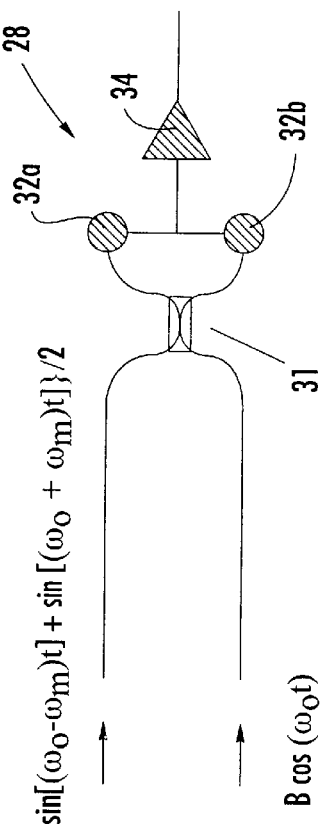
FIG. 2 illustrates a heterodyne detector of a fiber optic receiving antenna according to one embodiment of the present invention.

The fiber optic receiving antenna 10 includes a detector 28 optically connected to the first output of the output coupler 22. Typically, the detector is a heterodyne detector, such as a double balanced coherent receiver as described below. In this regard, one embodiment of the heterodyne receiver is depicted in FIG. 2 which illustrates a double balanced coherent receiver. In addition to the signal provided by the first output 22b of the output coupler, the double balanced coherent receiver receives a signal that is coherent with the reference signal generated by the master oscillator 12 and that can be represented as $B \cos(\omega_o t)$. Although the signal that is coherent with the reference signal generated by the master oscillator can be provided in a number of manners, a portion of the reference signal provided by the master oscillator could be tapped or diverted upstream of the input coupler 20 to serve as an input to the double balanced coherent receiver. Alternatively, the signal provided by the second output of the output coupler to the photodetector 26 could serve as an input to the double balanced coherent receiver since the signal provided by the second output of the output coupler is essentially equal to the reference signal generated by the master oscillator less some second order terms at the sideband frequencies.

The inputs to the heterodyne receiver 28 are combined by a coupler 31 such as a 3/dB fiber coupler. The coupler produces first and second outputs that are delivered to first and second detectors 32, typically first and second photodetectors. As a result of the combination of the input signals by the coupler, the signals provided by the coupler to the first and second photodetectors are:

$$(A\phi_0/2\sqrt{2})\sin[(\omega_0-\omega_m)t]-(B/\sqrt{2})sin(\omega_o t)+(A\phi_0/2\sqrt{2})\cos[(\omega_0+\omega_m)t]\}/2 \quad (4)$$

$$(A\phi_0/2\sqrt{2})\cos[(\omega_0-\omega_m)t]+(B/\sqrt{2}\cos(\omega_o t)+(A\phi_0/2\sqrt{2})\cos[(\omega_0+\omega_m)t]\}/2, \quad (5)$$

respectively.

Each photodetector 32 produces a photocurrent in response to the detected signals. The photocurrent generated by a photodetector can generally be determined by squaring the input signal presented to the photodetector and averaging this squared input signal over a time period that is relatively long with respect to an optical cycle. For purposes of the fiber optic receiving antenna 10 of the present invention, however, the photodetector outputs that are of interest are produced by the cross-terms. i.e., the beat signals, between a signal coherent with the reference signal generated by the master oscillator 12 and the upper and lower sideband signals. In particular, the signal of interest for the first photodetector 32a can be represented as:

$$i_{s1}=(-RBA\phi_0/2\sqrt{2})\{\sin[(\omega_0-\omega_m)t]\sin(\omega_o t)+\sin[(\omega_0+\omega_m)t]\sin(\omega_o t)\}=(-RBA\phi_0/2)\cos(\omega_m t). \quad (6)$$

Likewise, the signal of interest for the second photodetector 32b can be represented as:

$$i_{s1}=(RBA\phi_0/2\sqrt{2})\{\cos[(\omega_0-\omega_m)t]\cos(\omega_o t)+\cos[(\omega_0+\omega_m)t]\cos(\omega_o t)\}=(RBA\phi_0/2)\cos(\omega_m t). \quad (7)$$

As set forth by equations (6) and (7), the signal of interest for each photodetector 28 is based in part upon the factor R which is a measure of the quantum efficiency and responsivity of a photodetector 32 as known to those skilled in the art. The dc current produced by each photodetector is also at least partially based upon the factor R. In this regard, each photodetector generates a dc photocurrent based upon the contributions of the reference signal provided by the master oscillator 12 and the upper and lower sideband signals. However, the dc photocurrent generated by the photodetector that is derived from the upper and lower sideband signals is negligible relative to the dc photocurrent generated by the photodetector based upon the reference signal provided by the master oscillator. Thus, the dc photocurrent generated by each photodetector can be represented as $i_{dc}=RB^2/8$.

As shown in FIG. 2, the heterodyne receiver 28 also includes an amplifier 34 that sums the photocurrent produced by each photodetector 32. For the signals of interest produced by the cross-terms, i.e., beat signals, between a signal coherent with the reference signal generated by the master oscillator 12 and the upper and lower sideband signals, the amplifier generates a net signal current of $RBA\phi_0 \cos(\omega_m t)$. As will be noted, the net signal current replicates the original electric field since $\phi_0$ is proportional to the strength of the electric field $E_m$ and $\cos(\omega_m t)$ represents the time dependence of the electric field. By analyzing the net signal current produced by the amplifier, such as by means of a microcontroller or the like, the electric field to which the fiber optic receiving antenna 10 is exposed can be determined on an ongoing basis. As such, the fiber optic receiving antenna can be utilized to receive a variety of signals, such as RF signals, that induce an electric field which, in turn, creates a corresponding output from the amplifier of the heterodyne receiver. However, the fiber optic receiving antenna is non-metallic and does not induce any currents and, therefore, does not re-radiate any of the incident power. Accordingly, the fiber optic receiving antenna is particularly desirable for commercial applications, such as instrumentation applications, that do not wish to perturb the incident signals with re-radiated signals, as well as for military applications in which the fiber optic receiving antenna is mounted upon an LO aircraft.

As described above, an incident electric field modifies the effective refractive index $n_o$ of an electrooptically active optical fiber which, in turn, creates a phase shift $\phi_0$. As described above, $\phi_0$ can be equal to the phase shift induced by a dc field applied to the optical fiber that is equal to the peak electric field $E_m$. In order for the maximum phase shift to be created, the electric field must impinge upon the fiber optic interferometer 14 with a predetermined orientation. In this regard, optical fibers can be designed to have axes along which the optical fibers will respond preferentially. For example, single crystal optical fiber formed of lithium niobate or lithium tantalate can be drawn so as to have the positive c-axis, i.e., the polar axis, either parallel or perpendicular to the longitudinal axis of the optical fiber. The optical fiber will then respond preferentially by creating the maximum phase shift in response to those components of the electric field that are oriented parallel to the c-axis of the optical fiber. The optical fiber is therefore preferably designed and mounted, such as within the skin of an aircraft, such that the c-axis of the optical fiber is oriented in a direction that is parallel to the orientation of the electric field for which it is designed to detect, thereby permitting the largest phase shift to be induced. Likewise, silica-based optical fibers can be polarized by subjecting the silica-based optical fibers to electric fields at elevated temperature in order to tailor the silica-based optical fiber to preferentially respond to either parallel or perpendicular electric fields.

In addition to the directional characteristics of the fiber optic receiving antenna 10 described above, the fiber optic receiving antenna also has bandwidth characteristics as described below. As shown in FIG. 3 for example, an angle θ can be defined between the direction of propagation of the electric field and the fiber optic receiving antenna and, more particularly, the longitudinal axes defined by the first and second arms 16, 18 of the fiber optic interferometer 14. Assuming that the optical fibers that form the first and second arms are designed to respond preferentially to electric field components that extend parallel to their longitudinal axes, the peak phase shift is a function of angle that can be defined as $\phi_0 = \phi_0(\theta) = \phi_0 \cos \theta$.

As known to those skilled in the art, the electric field that impinges upon the optical fiber will propagate along the optical fiber at a velocity of $c_m = c/\cos \theta$, thereby implying a velocity mismatch between the optical wave and the electric field. The velocity mismatch supported by the fiber optic interferometer 14 is much like the velocity mismatch which exists in a traveling wave electrooptic phase modulator in which a crystal is incorporated into a transmission line so that the electric field and the optical wave propagate through the structure together. If the phase velocities of the electric field and the optical wave are not equal, the bandwidth of the electrooptic phase modulator will be limited. This configuration was analyzed by Amnon Yariv in a textbook entitled Quantum Electronics published by John Wiley & Sons in 1989. This analysis yielded a correction factor for the phase shift obtained at microwave frequencies for which velocity mismatch impacts bandwidth as follows:

$$R = \{\exp[j\omega_m \tau_d (1 - c/n_0 c_m) - 1]\} / \{j\omega_m \tau_d (1 - c/n_0 c_m)\}.\text{tm} \quad (8)$$

As will be noted, if $c/n_o = c_m$, the electric field and the optical waves propagate synchronously and there is no bandwidth limitation.

With respect to the fiber optic receiving antenna 10 in which the electric field impinging upon the optical fibers propagates along the optical fibers at a velocity of $c_m = c/\cos \theta$, the angular response or pattern of the fiber optic receiving antenna can be determined based upon equation (8) as follows:

$$R(\theta) = \{\exp[j\omega_m \tau_d (1 - \cos \theta / \{n_0\} - 1] / j\omega_m \tau_d (1 - \cos \theta / n_0)\}. \quad (9)$$

Taking into account the angular response of a fiber optic receiving antenna 10, the net phase shift of the fiber optic receiving antenna is defined as $\phi_0(\theta) R(\theta) = \phi_0 R(\theta) \cos \theta$. This function can be evaluated numerically to obtain the response in the fiber optic receiving) antenna as a function of the angle of arrival θ and the frequency $\omega_m$. By way of example, the far field pattern of a fiber optic receiving antenna having first and second arms 16, 18 that each have a length of 10 cm and that each are formed by lithium niobate optical fibers having a refractive index of n=2.0 is depicted in FIGS. 4a and 4b at 1 GHz and 4 GHz, respectively. As shown, the response of the fiber optic receiving antenna is a maximum in a direction parallel to the longitudinal axes of the optical fibers that form the first and second arms, i.e., θ=0. The response of the fiber optic receiving antenna then drops off as frequency increases. The fiber optic receiving antenna also has a backlobe in the direction of the longitudinal axes of the optical fibers that form the first and second arms that drops off far more quickly than the main lobe because of the higher decree of velocity mismatch between the optical wave and the electric field.

Thus, the fiber optic receiving antenna 10 should preferably be mounted so as to define an angle of arrival relative to the anticipated direction of propagation of the electric field that maximizes the response of the antenna at the frequency of interest. As known to those skilled in the art, various techniques exist for managing velocity mismatch and, therefore, for extending the frequency response of an antenna. For example, the polarity of the electrooptic effect of an optical fiber can be periodically reversed in order to extend the frequency response of a fiber optic receiving, antenna. In this regard, each electrooptically active optical fiber of the fiber optic interferometer 14 can include two or more segments of optical fiber that are connected serially and that have opposite electrooptic effects.

Accordingly, the fiber optic receiving antenna 10 of the present invention detects an incident electric field and attains the measure thereof without re-radiating any portion of the incident power. As such, the fiber optic receiving antenna is particularly desirable for commercial applications that do not wish to perturb the incident electric field which could disadvantageously alter further measurements, such as instrumentation applications. In addition, the fiber optic receiving antenna of the present invention can advantageously be mounted upon or within the skin of an LO aircraft so as to permit signals to be received without re-radiating any portion of the incident power which could otherwise compromise the radar cross section of the LO aircraft.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A fiber optic receiving antenna comprising:
   a master oscillator for generating a reference signal having a predetermined amplitude and frequency;
   a fiber optic interferometer comprising:
      first and second arms comprised of respective optical fibers, each arm receiving at least a portion of the reference signal generated by said master oscillator at least one of said optical fibers being electrooptically active, and the respective electrooptic activity of said optical fibers that comprise said first and second arms being different; and
      a coupler for combining signals that have propagated along said first and second arms
      wherein said fiber optic interferometer is responsive to an incident electric field such that the signals propagating along said first and second optical fibers are modulated differently by the incident electric field; and
   a detector for receiving the combined signals from said coupler and for generating a signal that is at least partially dependent upon the incident electric field.

2. A fiber optic receiving antenna according to claim 1 further comprising a phase modulator disposed within one of said first and second arms for tuning said fiber optic interferometer.

3. A fiber optic receiving antenna according to claim 1 wherein said optical fiber that comprises said first arm is polarized differently than said optical fiber that comprises said second arm.

4. A fiber optic receiving antenna according to claim 1 wherein each optical fiber preferentially responds to an incident electric field that is oriented at a predetermined angle relative to said respective optical fiber.

5. A fiber optic receiving antenna according to claim 1 wherein said detector is a double balanced coherent receiver.

6. A fiber optic receiving antenna comprising:
  a fiber optic interferometer comprising:
    first and second arms comprised of respective optical fibers, at least one of said optical fibers being electrooptically active, and the respective electrooptic activity of said optical fibers that comprise said first and second arms being different; and
    a coupler for combining signals that have propagated along said first and second arms,
    wherein said fiber optic interferometer is responsive to an incident electric field such that the signals propagating along said first and second optical fibers are modulated differently by the incident electric field; and
  a phase modulator disposed within one of said first and second arms for tuning said fiber optic interferometer.

7. A fiber optic receiving antenna according to claim 6 further comprising a photodetector for receiving the combined signals from said coupler and for driving said phase modulator in response thereto.

8. A fiber optic receiving antenna according to claim 7 wherein said coupler generates first and second outputs based upon the combined signals, and wherein said photodetector receives the second output and drives said phase modulator to reduce the second output in the absence of the incident electric field.

9. A fiber optic receiving antenna according to claim 6 wherein said optical fiber that comprises said first arm is polarized differently than said optical fiber that comprises said second arm.

10. A fiber optic receiving antenna according to claim 6 wherein each optical fiber preferentially responds to an incident electric field that is oriented at a predetermined angle relative to said respective optical fiber.

11. A fiber optic receiving antenna according to claim 6 further comprising a detector for receiving the combined signals from said coupler and for generating a signal that is at least partially dependent upon the incident electric field.

12. A fiber optic receiving antenna according to claim 11 wherein said detector is a double balanced coherent receiver.

13. A fiber optic receiving antenna according to claim 6 further comprising a master oscillator for generating a reference signal having a predetermined amplitude and frequency that is delivered, at least in part, to both said first and second arms of said fiber optic interferometer.

14. A fiber optic receiving antenna comprising:
  a fiber optic interferometer comprising:
    first and second arms comprised of respective optical fibers, said optical fiber that comprises each arm being polarized differently; and
    a coupler for combining signals that have propagated along said first and second arms,
    wherein said fiber optic interferometer is responsive to an incident electric field such that the signals propagating along said first and second optical fibers are modulated differently by the incident electric field; and
  a heterodyne detector for receiving the combined signals from said coupler and for generating a signal that is at least partially dependent upon the incident electric field.

15. A fiber optic receiving antenna according to claim 14 wherein said optical fiber that comprises said first arm is positively polarized and said optical fiber that comprises said second arm is negatively polarized.

16. A fiber optic receiving antenna according to claim 14 wherein said optical fiber that comprises said first arm is polarized and said optical fiber that comprises said second arm is nonpolarized.

17. A fiber optic receiving antenna according to claim 14 wherein each optical fiber preferentially responds to an incident electric field that is oriented at a predetermined angle relative to said respective optical fiber.

18. A fiber optic receiving antenna according to claim 14 further comprising a phase modulator disposed within one of said first and second arms for tuning said fiber optic interferometer.

19. A fiber optic receiving antenna according to claim 14 further comprising a master oscillator for generating a reference signal having a predetermined amplitude and frequency that is delivered, at least in part, to both said first and second arms of said fiber optic interferometer.

20. A fiber optic receiving antenna according to claim 14 wherein said heterodyne detector is a double balanced coherent receiver.

* * * * *